United States Patent
Meyer et al.

(10) Patent No.: US 6,650,249 B2
(45) Date of Patent: Nov. 18, 2003

(54) WIRELESS AREA NETWORK COMMUNICATIONS MODULE FOR UTILITY METERS

(75) Inventors: Peter R. Meyer, Apex, NC (US); Garry M. Loy, Raleigh, NC (US); David F. Dunn, Raleigh, NC (US); Rodney C. Hemminger, Raleigh, NC (US); Charles Cunningham, Jr., Raleigh, NC (US)

(73) Assignee: Elster Electricity, LLC, Horsham, PA (US)

( * ) Notice: Subject to any disclaimer, the term of this patent is extended or adjusted under 35 U.S.C. 154(b) by 0 days.

(21) Appl. No.: 09/905,145

(22) Filed: Jul. 13, 2001

(65) Prior Publication Data

US 2001/0038343 A1 Nov. 8, 2001

Related U.S. Application Data

(62) Division of application No. 09/301,805, filed on Apr. 29, 1999.
(60) Provisional application No. 60/083,949, filed on May 1, 1998.

(51) Int. Cl.[7] .............................................. G08C 19/12
(52) U.S. Cl. ............................ 340/870.28; 340/870.11; 375/222; 700/291
(58) Field of Search ....................... 340/870.02, 870.11; 700/286, 291; 375/222

(56) References Cited

U.S. PATENT DOCUMENTS

| | | | |
|---|---|---|---|
| 4,614,945 A | 9/1986 | Brunius et al. ........ 340/870.03 |
| 4,833,618 A | 5/1989 | Verma et al. ................ 364/483 |
| 5,056,107 A | 10/1991 | Johnson et al. ................. 375/1 |
| 5,430,430 A | 7/1995 | Gilbert ................... 340/310.01 |
| 5,473,322 A | 12/1995 | Carney ................... 340/870.02 |
| 5,553,094 A | 9/1996 | Johnson et al. ............. 375/200 |
| 5,576,700 A | 11/1996 | Davis et al. ........... 340/825.16 |
| 5,594,740 A | 1/1997 | LaDue ........................ 379/59 |
| 5,631,843 A * | 5/1997 | Munday et al. ............. 700/286 |
| 5,659,300 A | 8/1997 | Dresselhuys et al. .. 340/870.02 |
| 5,748,104 A | 5/1998 | Argyroudis et al. ... 340/870.11 |
| 5,898,387 A * | 4/1999 | Davis et al. ........... 340/870.02 |
| 5,914,672 A | 6/1999 | Glorioso et al. ....... 340/870.02 |
| 5,963,146 A | 10/1999 | Johnson et al. ........ 340/870.01 |
| 6,014,089 A | 1/2000 | Tracy et al. ........... 340/870.02 |
| 6,034,623 A * | 3/2000 | Wandel ................. 340/870.02 |
| 6,067,029 A | 5/2000 | Durston ................. 340/870.03 |
| 6,100,817 A | 8/2000 | Mason, Jr. et al. ..... 340/870.02 |
| 6,150,955 A | 11/2000 | Tracy et al. ........... 340/870.02 |
| 6,172,616 B1 | 1/2001 | Johnson et al. ........ 340/870.02 |
| 6,246,677 B1 | 6/2001 | Nap et al. .................... 370/346 |
| 6,333,975 B1 * | 12/2001 | Brunn et al. ........... 340/870.02 |

* cited by examiner

Primary Examiner—Timothy Edwards
(74) Attorney, Agent, or Firm—Woodcock Washburn LLP

(57) ABSTRACT

A communications module that permits remote meter reading of a utility meter via a wireless modem that communicates using data packet networks along a communications system, such as ARDIS. The communications module is a microprocessor-based transmitter/receiver which receives data collection requests from a system server, initiates data collection from a utility meter, and reports the data back to a host computer system residing, for example, at a central office. Preferably, session-based communication using the meter protocol is implemented between the communications module and the meter, and packet switching is used between the communications server and the communications module through the network.

7 Claims, 5 Drawing Sheets

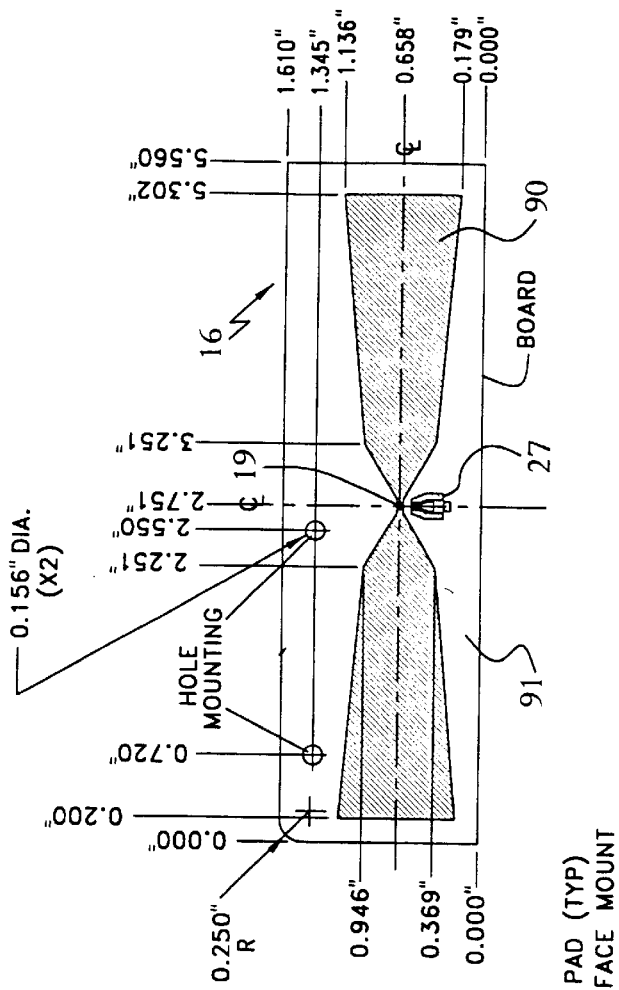
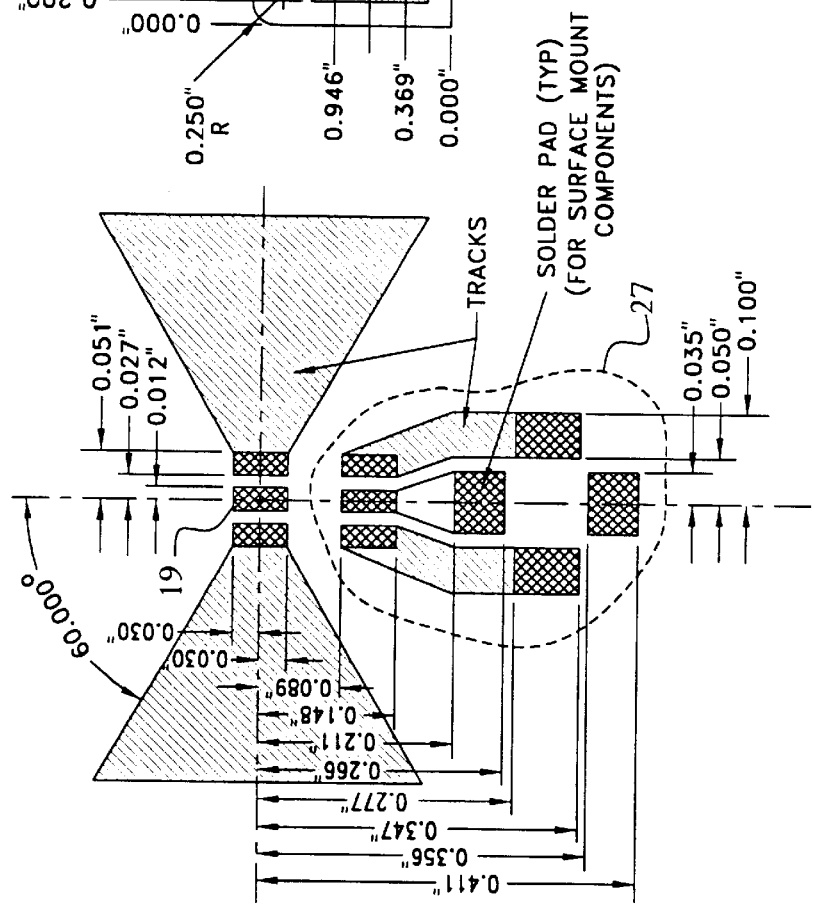
FIG. 5(a)
FIG. 5(b)

WIRELESS AREA NETWORK COMMUNICATIONS MODULE FOR UTILITY METERS

This Application is a divisional of application Ser. No. 09/301,805 filed Apr. 29, 1999 (pending) which claims the benefit of U.S. provisional Application Ser. No. 60/083,949, filed May 1, 1998.

FIELD OF THE INVENTION

The present invention relates in general to the field of utility meters. More particularly, the present invention relates to automatic equipment and systems for remote reading of utility meters, such as electric, gas, or water meters, via a wireless area network communications module.

BACKGROUND OF THE INVENTION

The recent deregulation of the utility industry has created a market for products that provide a utility or its customers with their usage via a utility usage meter. Utility companies use utility usage meters to determine the utility consumption at a customer site. A periodic reading of the utility meter is necessary to determine the usage and to bill the customer for the amount used. The need to send utility company employees to customer sites to read the meters is costly, time consuming, and dangerous. Moreover, the frequency of meter reading is increasing, e.g., daily, hourly, every 15 minutes, etc, in order to take advantage of real time pricing. Also, the amount of data is increasing, due to the necessity to bill on more than just consumption, e.g., time of use. Thus, automated means of recording and reporting the utility usage at customer sites is rapidly replacing the manually read utility meters.

Many companies provide automatic meter reading equipment that is capable of reading meters on customer premises and transmitting the meter readings automatically to a central office of the utility company. Typical systems use telephone schemes for transmitting the meter readings to the central office, and must be connected to line voltage, making it more dangerous and time consuming to install.

In the past, there has been on-site meter reading equipment having modem capability which was capable of receiving telephone calls from a central office through the use of special equipment located at the telephone company, and there have also been on-site meters with modems which were capable of placing telephone calls to the central office. In general, these systems incorporate an auto-dial, auto-answer modem in each customer site to receive interrogation signals from the telephone line and to formulate and transmit meter readings via the telephone line to the utility company. Prior art systems record information on utility usage and periodically dial into a central office to report the utility usage for recording and billing purposes. These systems are used for reporting electric, gas, and water usage, and the like.

Some prior art systems connect to a customer's existing telephone line to communicate with the central office by sending information over the telephone lines. The modem shares the telephone line with the customer's normal usage, such as incoming and outgoing voice communications. Such sharing requires that the system be able to recognize when the telephone line is in use, and to delay demanding use of the telephone line until it is free. Steps must be taken to prevent the data communications system from interfering with other uses and to prevent other uses from corrupting the transmitted data. Many locations require extensive trenching which is extremely costly.

Although the art of providing meter data to a central site or host is well developed, there remain some problems inherent in this technology, particularly the use of telephone lines that are shared with a customer's normal usage. Therefore, a need exists for systems to provide meter data to a central office or host that overcomes the drawbacks of the prior art.

SUMMARY OF THE INVENTION

The present invention is directed to a communications module that permits remote meter reading of a utility meter via a wireless modem that communicates using data packet networks along a communications system, such as ARDIS. The communications module is a microprocessor-based transmitter/receiver that receives data collection requests from a system server, initiates data collection from a utility meter, and reports the data back to a host computer system residing, for example, at a central office. The communications module may also issue requests to the meter and send the data back to the host, without an initiating request. Preferably, session-based communication using the meter protocol is implemented between the communications module and the meter, and packet switching is used between the communications server and the communications module through the network.

An embodiment within the scope of this invention includes a communications module for transmitting data between a meter and a host over a network. The communications module comprises a connector coupled to the meter for receiving meter data from the meter and providing the meter data to a controller; a controller for controlling the operation of the communications module and for converting the meter data into a host protocol representing the meter data and host data and for providing the data to a radio modem; the radio modem for transmitting and receiving signals representing the meter data and host data to and from the host; and an antenna coupled to the radio modem.

According to one aspect of the invention, the communications module further comprises a power supply coupled to the controller and the radio modem for supplying power to the controller and the radio modem. Preferably, the power supply is coupled to a meter power supply.

According to further aspects of the invention, the communications module further comprises an energy storage device coupled to the power supply for storing power to be used by the power supply. Preferably, the energy storage device comprises a capacitor and/or a battery.

According to further aspects of the invention, the antenna comprises a double-tapered dipole and a one-to-one balun. Preferably, the antenna is internal, and the communications module further comprises an external antenna. More preferably, the external antenna is a ground-plane antenna, an omni-directional antenna, a ¼-wave antenna, or a ½-wave whip antenna.

According to a further aspect of the invention, the module is connectable to a plurality of meters for multipoint meter reading.

According to another aspect of the invention, the communications module comprises a power outage detector. Preferably, the power outage detector is configured to alert the host of a power outage after a predetermined programmable time.

According to another aspect of the invention, the controller is adapted to detect at least one alarm condition.

Another embodiment within the scope of this invention includes a wide area network option board that comprises a power supply; a current limiter coupled to the power supply; a header coupled to the current limiter; and a serial communications device coupled to the header. Preferably, the power supply is an isolated step-up converter.

Another embodiment within the scope of this invention includes a meter that comprises the communications module described above. According to another aspect, the meter further comprises the wide area network option board described above.

According to further aspects of the present invention, the meter comprises a display for displaying radio modem status information at predetermined intervals. The radio modem status information comprises at least one of signal strength, signal quality, and module location suitability.

The foregoing and other aspects of the present invention will become apparent from the following detailed description of the invention when considered in conjunction with the accompanying drawings.

BRIEF DESCRIPTION OF THE DRAWINGS

FIG. 5(a) shows an exemplary antenna for use in a preferred embodiment in accordance with the present invention; and FIG. 5(b) shows details of the antenna of FIG. 5(a).

DESCRIPTION OF EXEMPLARY
EMBODIMENTS AND BEST MODE

The present invention is directed to a communications module that permits remote meter reading of a utility meter via a wireless modem that communicates using data packet networks along a communications system, such as ARDIS, which is a public wireless packet switching network operated by American Mobile Satellite Corp.

Figure 1:
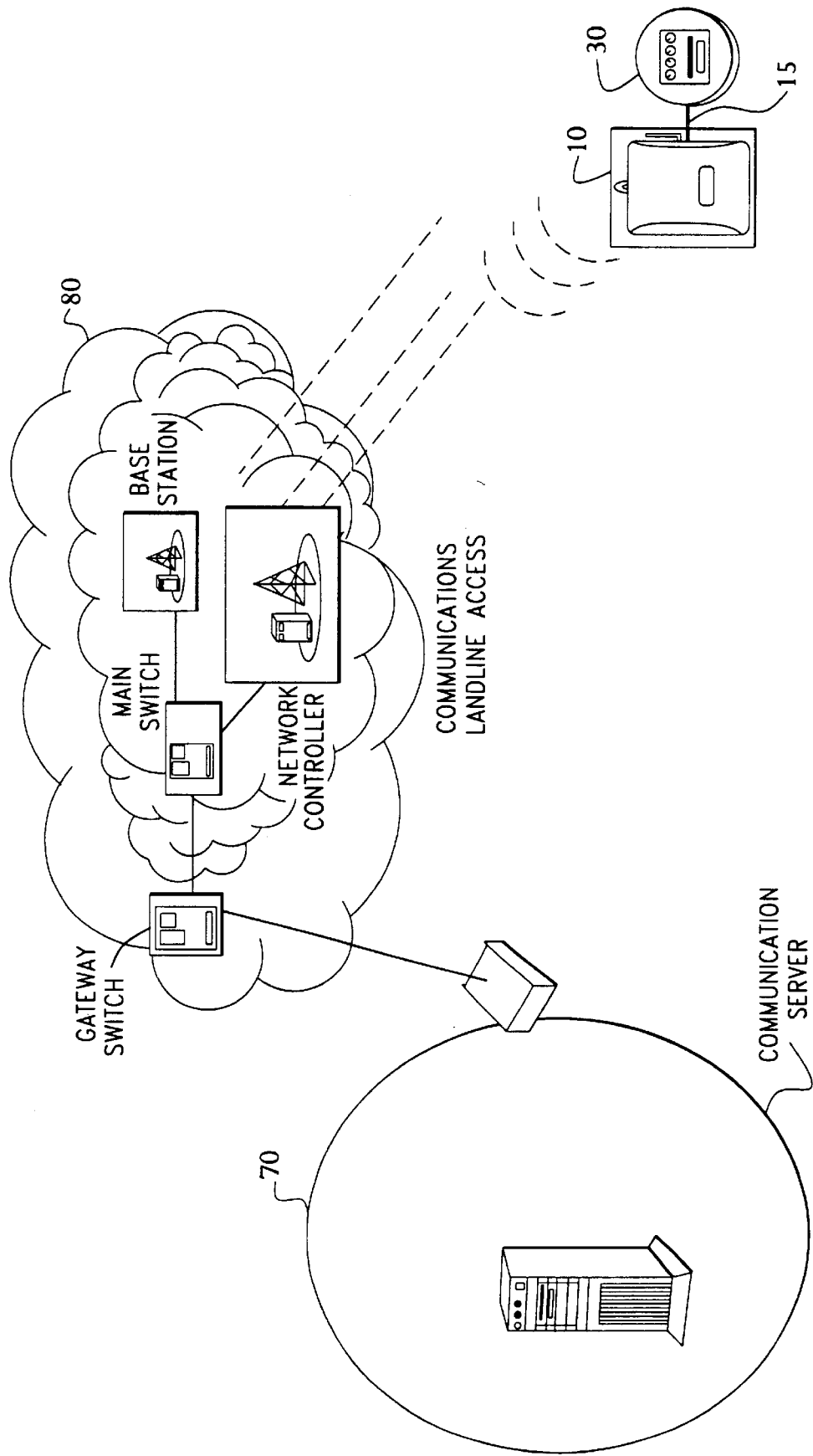
FIG. 1 is a overview of an exemplary system in accordance with the present invention.

Referring to FIG. 1, there is illustrated an overview of an exemplary network in which the present invention may be embodied. As illustrated, the network includes a communication server or host site 70, a wireless network 80, a communications module 10 and a meter 30.

The communications module 10 is a microprocessor-based transmitter/receiver that receives and/or generates data collection requests from a system server or a host computer system, initiates the data collection from a utility meter 30, and reports the data back to the host site 70 residing, for example, at a central office. The communications module 10 is a bridge between a wireless packet-based network and the utility meter 30. Preferably, session-based communication using the meter protocol is implemented between the communications module 10 and the meter 30, and packet switching is used between the communications server and the communications module 10 through the wireless network.

The communications module 10 continuously monitors the connection between the module 10 and the meter 30. Whenever communications are lost with the meter 30 due to a line power outage or tamper, the module waits a random length of time to allow the line to recover automatically. If the connection fails to recover, an alarm may be generated and transmitted to the communication server 70 for appropriate action. The communications module preferably responds to all requests and constantly monitors radio-related information. Additionally, the communications module 10 preferably supports (1) the meter protocol, (2) commands to get and/or set the meter/communications module configuration request and response, (3) commands to adjust and read the meter time, and (4) responses to notify of a power failure and/or power restoration.

The meter 30 is typically read over the wireless network 80 at a predetermined time (e.g., after midnight). The communications module 10 responds with the appropriate load profile data (e.g., for the previous 24 hours), time-of-use data, as well as any other data stored in the meter 30.

A typical communications exchange over the network proceeds as follows. The communication server or host site 70 sends a request over the wireless network 80 to the communications module 10. The communications module 10 receives the request, and retrieves the requested data from within the module 10 itself and/or the utility usage meter 30 (via transmit/receive cable 15). The data is the transmitted back to the communication server 70 via the wireless network 80 for further processing.

Although the communications module 10 is shown and described as being separate from the meter 30, it is contemplated that the communications module 10 can be implemented within the meter 30, in addition to providing the flexibility to be remotely located outside of the meter 30. The utility usage meter 30 preferably comprises an Alpha Power+Meter or Alpha Meter manufactured by ABB Power T&D Company. Other meters may be used as utility usage meter 30. It is noted that the preferred Alpha Meter or Alpha Power+Meter utilize a standard ABB protocol as a meter protocol. The communications module 10 enables communications over a wireless network 80, such as the ARDIS network in the United States and the BellARDIS network in Canada. Other packet switched wireless networks may be utilized as the present invention is particularly suitable for packet-based wireless transmission. Preferably, the communications server 70 comprises a CSM system or AMR server, available from ABB Power T&D Information Systems, Raleigh, N.C.

Figure 2:
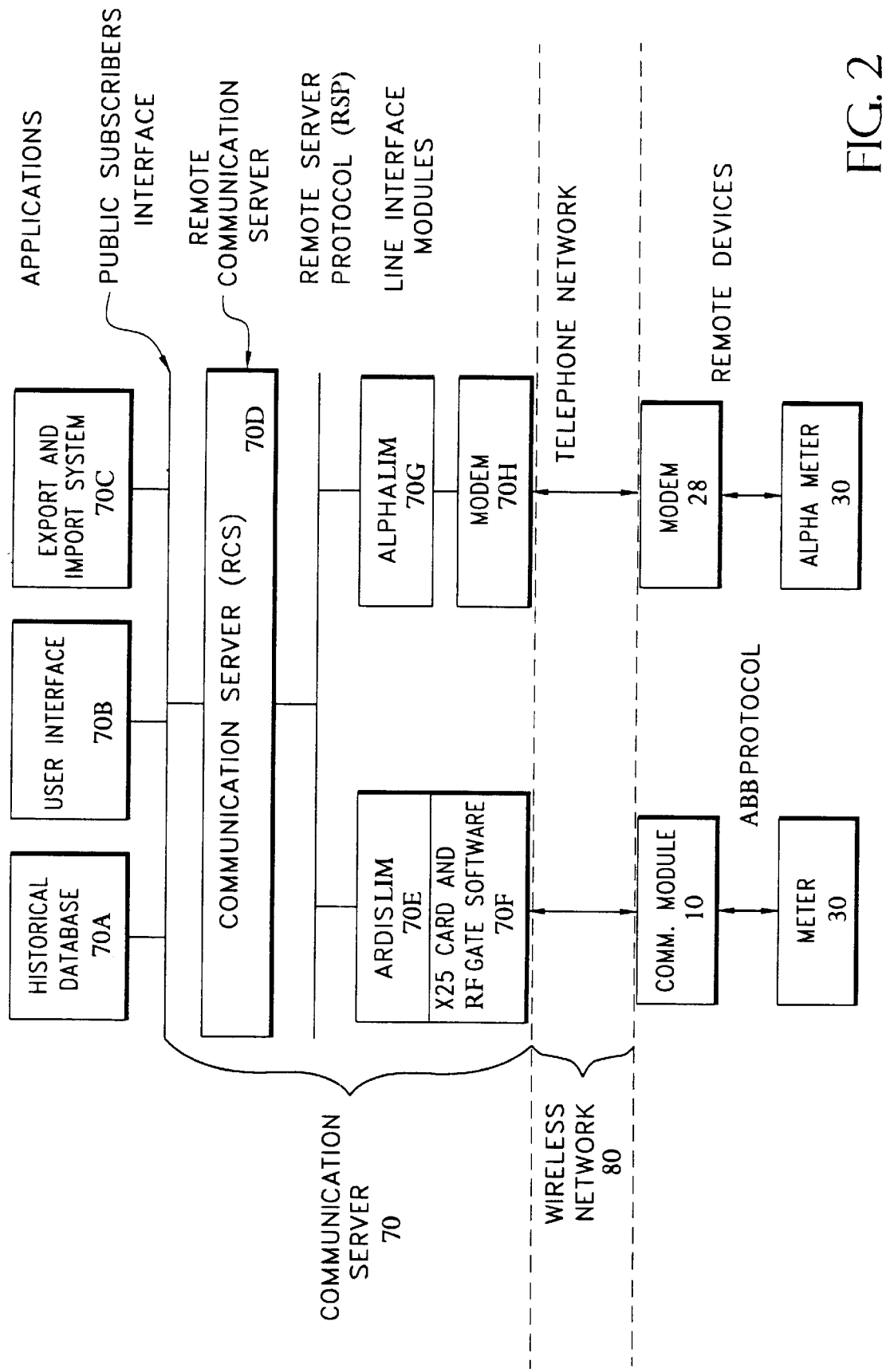
FIG. 2 is a functional block diagram of an exemplary communication server, wireless network, communications module, and meter in accordance with the present invention.

Referring to FIG. 2, there is illustrated a functional block diagram of the communication server 70, wireless network 80, communications module 10, and meter 30. As illustrated, the communication server 70 may be functionally divided into three main platforms. The Applications are services and processes that in some way manipulate data in the real time database. For example, the Applications may comprise an historical database 70A, a user interface 70B, and an export and import system 70C. Applications are not a part of the communication server 70 itself, and use a public subscriber interface to communicate with the remote communication server 70D and its real time database (not shown). The public subscriber interface is provided such that the remote communications server 70D does not need to be specifically programmed for each subscriber application, but rather can make all information collected therein publicly available.

The subscribing application then selects the information needed to fulfill its particular task.

The Remote Communication Server (RCS) 70D is the main application in the communication server 70 that serves other applications. The RCS 70D is built around the real time database. The real time database stores configuration and other data without any time stamp (i.e., using last reported values). Time stamped data are sent to the subscriber and stored in a relational database 70A for long term storage.

Line Interface Modules (LIM) are real-time interfaces that are used to communicate with remote devices (e.g., communications module 10 and meter 30). The LIMs are essentially protocol converters and are responsible for converting between the Remote Server Protocol (RSP) and the protocol used at the remote device (e.g., the ABB meter protocol). In the preferred embodiment utilizing the ABB Alpha Meter as utility meter 30, only two LIMs communicate with the ABB Alpha Meter. The AlphaLIM 70G communicates with the meter either using the public switched telephone network or a leased line (direct connection). The ArdisLIM 70E communicates with the Alpha Meter through the ARDIS radio network. The ArdisLIM 70E communicates with the ARDIS network 80 using an Internet connection, a leased line, or a dial-up line, and an X.25 card, available from Eicon Technology, Montreal, Quebec. RFGate software, available from Nettech Systems Inc., Princeton, N.J., is used as low-level access software to reach the X.25 line.

On the remote side, the meter 30 is connected to communications module 10. An exemplary communications module 10 is the AlphaStar, manufactured by ABB Power T&D Company. The communications module 10 comprises software that converts from the ARDIS RF protocol to the ABB Protocol used by the meter 30. Using the communications module 10 in combination with the ArdisLIM 70E, the meter 30 functions similarly as if it was connected to a telephone modem.

In addition, the meter 30 has a datalink feature, which facilitates communication with the communications module 10 and supports session-based, wireline transmission, thereby reducing the airlink protocol and minimizing airtime. The communication server 70 issues datalink requests. It is noted that the request from the communication server 70 to the meter 30 should be as small as possible for a maximum of 1 packet (240 bytes or 480 bytes, for example, depending on the protocol supported by the network at the install location). The response back from the meter 30 to the communication server 70 should minimize the data and put it into as few packets as possible (e.g., two or fewer for 2 channels of load profile data every 15 minutes for 24 hours).

Communications Module

Figure 3:
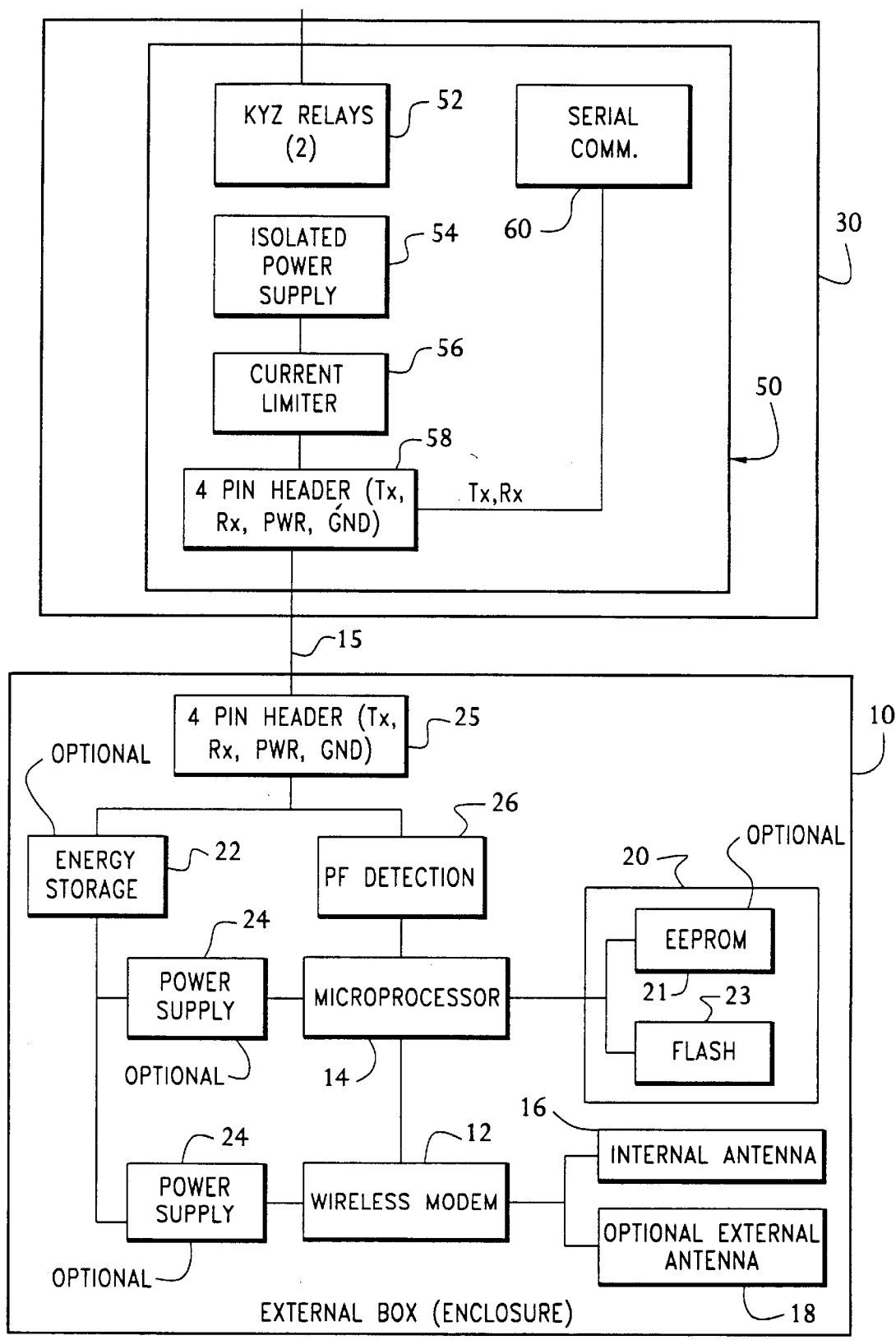
FIG. 3 is a functional block diagram of an exemplary communications module connected to an exemplary wide area network (WAN) option board in accordance with the present invention.

Referring to FIG. 3, the communications module 10 includes a radio or wireless modem 12, a microprocessor 14, an internal antenna 16, a memory 20 that is preferably nonvolatile, an optional power supply 24, and an optional energy storage device 22. Also included is a header 25, preferably having 4 pins: Tx, Rx, Power, and Ground. An optional external antenna 18, such as a standard ground-plane antenna, an omni-directional antenna, a ¼-wave antenna, or a ½-wave whip antenna, for example, can be used to improve radio coverage in fringe areas. The communications module 10 is connected to an option board 50 residing in the meter 30, which is described in further detail below. The communications module 10 further includes an outage or power failure (PF) detector 26. The communications module 10 preferably communicates at a rate between about 9600 and about 19200 bps, but any communication rate can be used. Moreover, the communications module 10 preferably has a programmable delay that is adjustable between about zero seconds and about 65535 seconds before reporting an outage.

The communication module contains a wireless modem 12 that communicates over various data-packet networks including, but not limited to, ARDIS, BellSouth Wireless Data, Reflex, GSM, satellite, and other packet wireless data networks. The type of modem that is used is dependent on the network that is used. The ARDIS network uses the Motorola DataTAC technology. A preferred modem is the Motorola ARDIS modem, model number 505sd. Another exemplary modem is an ARDIS modem from Research In Motion (RIM).

Preferably, the ARDIS modem from RIM has a 14-pin 1 mm pitch flat flex cable that it uses for signal pins only. The power for the modem is supplied via a two-wire Molex connector with a secured lock-fit. The 14-pin signal connector is a Low Insertion Force (LIF) type connector. The connector contacts are tin plated, which are preferably gold plated. The main advantage to using the RIM modem is that it has a simpler protocol (RAP) and can be used to communicate with an ARDIS modem or a RAM Mobile Data modem. This allows one protocol to be implemented in the processor that can talk to two networks, depending on which modem is attached. The RIM modem can be attached using very high bond tape, for example, manufactured by 3M, or by any other mechanical means.

The modem 12 uses a significant amount of power (e.g., about 1 A at 7.5 V or about 7.5 W) to transmit data. Preferably, the communications module 10 is powered from the DC voltage in the meter 30 instead of from AC power or an external source. Therefore, it is desirable to have some means of storing enough charge in the communications module 10 to be able to handle the transmission. There are a number of approaches to storing energy. One energy storage device 22 is a battery or series of batteries that are used to power the modem 12 and allow the electronics to draw power off the meter supply. However, few batteries are currently available that handle instantaneous current draws of 1 A and then return to zero current (0 A) draw. Modem manufacturers recommend using nickel cadmium (NiCad) batteries because this technology handles this type of load very well.

Another approach is to use capacitors as an energy storage device 22. Capacitors are less expensive than batteries and use less complicated charging circuits than those used for batteries. The capacitors also typically have a longer lifetime than batteries. Moreover, capacitors can be selected that have a high temperature rating and can last approximately 8 to 10 years in an outdoor environment. Measurement devices, including an analog-to-digital converter (ADC), can be used to measure the voltage on the capacitors while the modem is transmitting. This gives a digital representation of the derivative of the voltage on the capacitors with respect to time (dV/dT). As the capacitors age or begin to wear out, the capacitors are not able to store as much energy as they did when they were new. As the capacitors begin to wear out, the dV/dT curve will increase. Calculations are made to determine when the capacitors have aged such that they are no longer able to store enough energy to ensure the reliability of the product and can send an alarm notification to the host 70 indicating the unit should be replaced. It should be noted that the communications module can be supplied with power from any type of power source, and is not limited to the batteries or capacitors described above.

The energy storage capacity should be enough to support the transmitter for normal data transmission and alarm conditions, especially when a primary power outage occurs and should also accommodate retries. Alarm conditions include, but are not limited to, "no contact with the meter (possible cable cut)", "poor power quality", and "loss of power, possible theft condition".

A preferred microprocessor 14 is the H8S/2350, manufactured by Hitachi. The microprocessor 14 preferably has a 16-bit or 32-bit architecture, with a preferred operating frequency of about 3.6864 MHZ and operating voltage of 3.3 V. It should be noted the invention is not limited to this microprocessor and that any microprocessor can be used. The microprocessor 14 also preferably has an on-chip RAM and at least 2 universal asynchronous receiver transmitters (UARTs). One UART may be used for the connection to the meter 30, and the other for a connection to the radio modem 12.

The microprocessor 14 preferably interfaces to the radio modem 12 in "RAP" or "NCL" mode (or other appropriate protocol) depending upon the radio supplier chosen. The microprocessor 14 in the communications module 10 responds to requests from a server such as an Energy Axis™, CSM, C&I server, an AMR server, or RCS 250 communications server and converts these requests to meter 30 protocol requests. The microprocessor 14 listens to the radio modem 12, interprets requests, responds, preferably immediately, and/or passes those requests onto the meter 30, extracts the data, and converts it to a minimized packet response to the server request on a near-real time basis. A protocol is defined that is used to communicate between the communications module 10 and the host system 70. The communications module 10 passes data requests to the meter 30, retrieves the data from the meter 30, and returns it to the host system. The host system is responsible for re-assembling the data packets in their correct order, interpreting the data, and loading it into a database for evaluation.

The communications module 10 offers in-field upgradeability. This is accomplished through the use of flash memory 23. One of the major factors in choosing flash memory is the availability of the flash in single-supply programming voltage which eliminates the need to generate special supplies for programming purposes. The memory 23 operates at a minimum of about 3.3 V, but memory operable at other voltages can also be used. Because the bus width of the microprocessor 14 is preferably 16 bits, a 16-bit wide memory part is desired, although not required. The memory 23 is preferably at least 1 megabit in density and can be organized either as 128 kb×8 or as 64 kb×16, although 128 kb×8 is preferred. The access time is preferably between about 80 ns and 200 ns. If an 8-bit part is used, the access time becomes more critical because two accesses are required for each instruction fetch. This affects the operating speed directly so care must be taken in finding the right balance between total memory access times and operating frequencies. The communications module 10 can store host data in any optional storage means such as a RAM or EEPROM 21.

The communications module 10 is preferably mounted in a water-resistant enclosure (not shown), and positioned near a utility usage meter 30, but can be located anywhere. The enclosure houses the components of the communications module 10 including the internal antenna 16, the radio modem 12, an optional external antenna connector. The communications module enclosure is preferably weather resistant and has a connector for accepting the cable coming from the meter 30.

A watertight RF connection is also desirable so that an external antenna 18 can be connected. The external RF connector should have the ability to be directly coupled to the wireless modem 12 with a connector, preferably an MMCX or SMA connector. The external antenna 18 is preferably isolated from the meter to prevent a possible shock hazard. The communications module 10 preferably withstands the same environmental constraints placed on the utility meter.

A holeplug can be punched out of the bottom of the communications module 10 and a connector, such as an MMCX to type N coaxial adapter, can be inserted to accommodate the external antenna 18 to improve radio coverage in fringe areas.

When the communications module 10 is first installed, the energy storage device 22, if so equipped, is charged, and the module 10 initiates communications with the meter 30. The communications module 10 sends the meter ID back to the host 70 the first time it is connected to a meter. The communications module 10 does not send the meter ID back to the host 70 unless the meter ID stored in non-volatile RAM differs from that of the current meter ID (e.g., if it is attached to another meter).

The meter 30 preferably transmits an alarm notification when the meter 30 is tampered with, damaged, or power is removed due to an outage. The meter 30 also preferably transmits a notification when power is restored to the meter 30. The tamper and damage alarms are preferably approximately immediate. The outage notification and the power restored notification can be delayed by a randomly generated amount of time to avoid overloading the network.

WAN Board

The meter 30 preferably contains a removable wide area network (WAN) option board 50 that connects to the communications module 10, as shown in FIG. 3, and provides KYZ relays 52 (preferably two), a power supply 54, a current limiter 56, a pin header 58 (preferably having 4 pins: Tx, Rx, Power, and Ground), and a serial communications device 60. The current limiter 56 prevents anything in the communication module external enclosure from consuming too much current, which would cause the meter 30 to reset. Preferably, the transmit (Tx) and receive (Rx) pins on the header 58 are optically isolated from the meter 30.

The two KYZ relays 52 are preferably substantially identical. The power supply 54 is preferably an isolated step-up converter operating at maximum possible efficiency. It should be noted that the meter power supply is buffered by the communications module 10 to increase the short time duration energy capability. Preferably, the DC voltage is isolated by a transformer.

Figure 4:
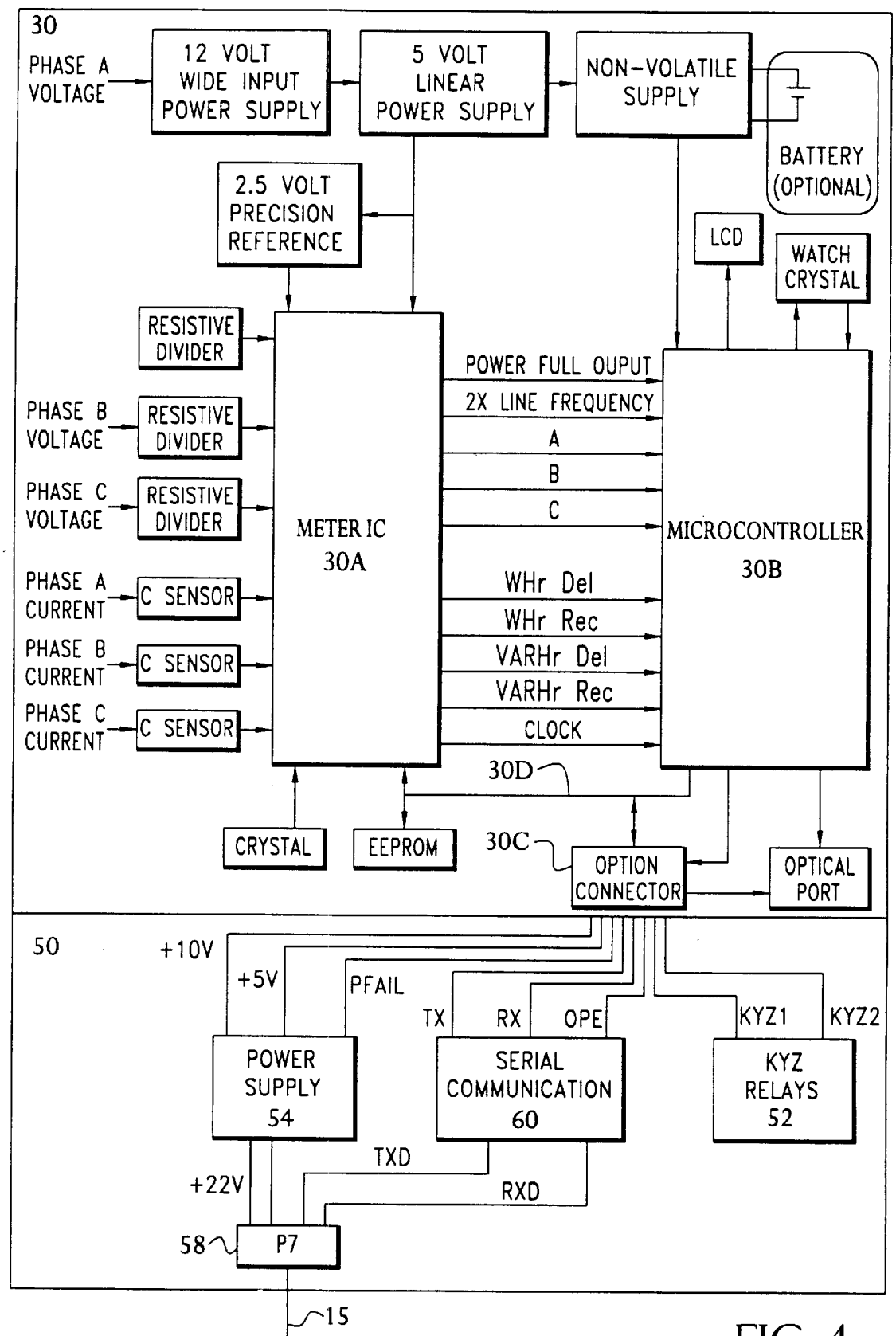
FIG. 4 is a functional block diagram illustrating the various components of the meter and WAN option board in greater detail, and the interconnection between the meter and the WAN option board.

Referring to FIG. 4, there is shown a functional block diagram of the interconnection of the option board 50 and the meter 30. As illustrated, the transmit/receive cable 15 connects to the pin header 58. The transmit (Tx) and receive (Rx) leads are input to the serial communication device 60. The power and ground lines are input to the power supply 54. The option board 50 is connected to an option connector 30C provided within the meter 30. The option connector 30C is connected to a serial communications line 30D, which is connected to the UART (not shown) within the microcontroller 30B. The UART preferably operates in a session-based fashion with the option board 50 to receive and transmit data and commands from the option board 50 and the communications module 10. Information and commands may be passed from the communications module 10 to the microcontroller 30B or Meter IC 30A via the option connector 30C to affect the operation of the microcontroller 30B or Meter IC 30A and other functions controlled by the microcontroller 30B or Meter IC 30A.

It is noted that the connection between option board 50 and the option connector 30C is illustrated in the exemplary configuration as having certain signals or leads. The connection between option board 50 and the option connector 30C is not limited to such signals, nor is the option board 50 limited to having the disclosed elements and functions, as other functionalities may be provided.

Antenna

An internal antenna 16 is mounted within the communications module enclosure. In areas where transmission interference is prevalent or network/host signal levels are irregular or insufficient, an external antenna 18 can be used. The external antenna connector can use the same jumper as the internal antenna.

Preferably, a double-tapered dipole antenna, as shown in FIG. 5(*a*), is used as the internal antenna 16. An exemplary antenna is a double-tapered, printed circuit dipole for about 806 to about 870 MHZ, and preferably comprises a copper plate 90 shaped in the desired antenna pattern. The dipole length is adjusted to compensate for the dielectric loading effects of both the antenna printed circuit board 91 and the enclosure in which the communications module 10 is mounted. Thus, the antenna 16 is preferably shortened from its free-space resonant length, and tuned to match its environment. The antenna has extended dipoles and enhances broad bandwidth. The additional taper of the dipoles in the vicinity of the feed-point gap in the center of the antenna 16 center provides a match to a transmission line, preferably 50 ohm. The double taper provides more bandwidth than a single bowtie antenna or an antenna with no taper. Also in the center of the antenna is a one-to-one balun 19, preferably 50 ohm and a printed circuit balun, shown in detail in FIG. 5(*b*). The balun 19 converts unbalanced coaxial cable to balanced termination for a balanced dipole antenna. The balun 19 prevents currents induced in the coaxial cable shield from flowing into the antenna as unbalanced and disturbing the feed-point impedance and antenna radiation pattern. A jack 27, preferably an MMCX female jack, is included to terminate the cable from the modem 12. Although FIGS. 5(*a*) and 5(*b*) show exemplary measurement specifications, it is contemplated that the specifications can be changed in accordance with the desired antenna characteristics.

Outage Detection

The communications module 10 continuously monitors the connection between the module 10 and the meter 30. Whenever communications are lost with the meter 30 due to a line power outage or tamper, the module waits a programmable, predetermined length of time, such as two minutes, to allow the line to recover automatically. Then the module 10 waits a random amount of time, for example, between about zero and about 65535 seconds, to transmit an outage notification message to the host 70. When power is restored, the communications module 10 waits a random amount of time, for example, between about zero and about 65535 seconds before waking up the modem 12, thereby enabling the transmitter so that it can log on the network. After power is restored, the modem 12 waits a random amount of time, for example, between about five and ten minutes, to send a "back in service" notification or message to the host 70 indicating that power has been restored.

The communications module 10 desirably has a configurable outage detection. The communications module 10 determines whether or not to do outage reporting based on remotely controllable configuration settings. If this field is set in the communications module 10, then the communications module 10 will alert the host system 70 of an outage.

Thus, the communications module 10 preferably supports the outage reporting feature of the meter 30, whether the meter 30 supports it or not. The communications module 10 will transmit an outage message within a programmable time of, for example, between about zero and about 65535 seconds following the initiation of the power failure. A message will also be transmitted to report power restoration following the return of power to the meter 30. There will be a random delay in sending the restoration message of, for example, between about one and fifteen minutes. This delay facilitates restoration reporting without overloading the system with an instantaneous receipt of multiple incoming messages.

After the power fails, the communications module 10 reduces current draw on the system by turning off all unneeded peripherals and putting the microprocessor 14 in the lowest power mode available. The communications module 10 also controls the modem power usage mode to further reduce power. As described above, the communications module 10 then waits a random amount of time between the minimum and maximum values it has been programmed with before waking back up. Upon wake-up, the microprocessor 14 verifies that power is still out and if it is, proceeds to transmit the outage notification to the host 70. If the power has been restored, the communications module 10 proceeds as normal, without transmitting the outage notification. If power is restored while the microprocessor 14 is asleep, the communications module 10 aborts the outage sequence.

If the meter 30 is read over the network 80 at a predetermined time (e.g., after midnight), the communications module 10 responds with the appropriate load profile data (e.g., for the previous 24 hours). Time-of-use data, and preferably any other data stored in the meter 30, can be retrieved by the host. The communications module 10 preferably responds to all requests and constantly monitors radio coverage, and signal strength. A summary of the minimum, maximum, and average Receive Signal Strength Indicator (RSSI) along with the number of times the modem 12 has gone out of coverage, along with other status information, can be returned with a predefined host command.

The communications module 10 preferably supports the meter protocol, and commands to get and/or set the meter/communications module configuration request, and to adjust the meter time, and responses to notify of a power failure and/or power restoration, to provide the get and/or set the meter/communications module configuration response, and to provide the meter time.

Status Display

The communications module 10 further provides the ability to display the status of the wireless modem 12 on the meter 30. The display on the meter 30 can be interrupted (not lost) at predetermined intervals to show such radio status information as signal strength (e.g., Receive Signal Strength Indicator or RSSI), signal quality, and whether it is recommended that the module 10 be placed elsewhere (e.g., "yes" means the module is functioning properly and does not need to be moved, "no" means that the location is not suitable and the module should be located elsewhere). The determination of "yes" or "no" is made responsive to the RSSI values. The meter display is also used to alert personnel when the meter is being queried by the host (by displaying "busy").

The information to be transmitted is encapsulated in a protocol. A listening module is preferably implemented in the network 80 to transfer information packets and perform any needed protocol conversion.

Preferably, the meter 30 has a clock and transmits its time and date information back to the communications module 10 and host 70 along with additional data obtained from a meter reading. Moreover, the clock is preferably synchronized with a national time standard prior to making data collections. The communications module 10, after performing all meter functions for a transmission, reads the meter clock and builds a time and date information message and sends it to the host 70. The host 70 determines whether or not the meter time is within the limit by comparing the transmission delay to the differences between meter time and host time. If the host determines that the meter time is off, the host 70 sends the communications module 10 the difference to adjust the meter time. The difference can be positive or negative. The communications module 10 then adjusts the meter's clock. If the host 70 cannot determine the meter time accuracy, it tries again during the next clock cycle and generates an alarm if unsuccessful. The time synchronization is described in pending U.S. patent application "TIME SYNCHRONIZATION OF A UTILITY METER VIA A WIRELESS NETWORK", Ser. No. 09/094,332 (attorney docket number ABME-0490), which is commonly assigned and which is incorporated herein by reference.

Although illustrated and described herein with reference to certain specific embodiments, the present invention is nevertheless not intended to be limited to the details shown. Rather, various modifications may be made in the details within the scope and range of equivalents of the claims and without departing from the invention.

What is claimed:

1. A meter comprising:
    a communications module comprising:
        a connector coupled to the meter for receiving meter data from the meter and providing said meter data to a controller;
        a controller for controlling the operation of the communications module and for converting said meter data into a host protocol representing said meter data and host data and for providing said data to a radio modem;
        said radio modem for transmitting and receiving signals representing said meter data and host data to and from the host using packet-based wireless transmission along a public wireless packet switching network;
        an antenna coupled to said radio modem;
        a display for displaying radio modem status information comprising at least one of signal strength, signal quality, and module location suitability, at predetermined intervals.

2. The meter of claim 1, further comprising a wide area network option board having a power supply, a current limiter coupled to the power supply, a header coupled to the current limiter, and a serial communications device coupled to the header, wherein the communications module is connected to the option board.

3. The meter of claim 2, wherein the communications module is external to the wide area network option board.

4. The meter of claim 2, wherein the wide area network option board further comprises a plurality of KYZ relays.

5. The meter of claim 2, wherein the header comprises an isolated output power supply pin.

6. The meter of claim 2, wherein the wide are network option board is removable from the meter.

7. The meter of claim 2, wherein the power supply is an isolated step-up converter.

* * * * *